(12) United States Patent
Hua

(10) Patent No.: US 11,488,048 B2
(45) Date of Patent: Nov. 1, 2022

(54) DEVICE, SYSTEM, AND METHOD FOR QUBIT CALIBRATION, MEASUREMENT AND CONTROL

(71) Applicant: ALIBABA GROUP HOLDING LIMITED, Grand Cayman (KY)

(72) Inventor: Xu Hua, Fremont, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 169 days.

(21) Appl. No.: 16/779,337

(22) Filed: Jan. 31, 2020

(65) Prior Publication Data

US 2020/0250568 A1  Aug. 6, 2020

(30) Foreign Application Priority Data

Feb. 2, 2019 (CN) .......................... 201910107886.2

(51) Int. Cl.
*G06N 10/00* (2022.01)
*H03K 3/38* (2006.01)
(52) U.S. Cl.
CPC .............. *G06N 10/00* (2019.01); *H03K 3/38* (2013.01)
(58) Field of Classification Search
CPC ................... G06N 10/00; H03K 3/38
See application file for complete search history.

(56) References Cited

U.S. PATENT DOCUMENTS

| 9,134,047 | B2 | 9/2015 | Black et al. |
| 9,858,531 | B1* | 1/2018 | Monroe .................. G06F 15/76 |
| 2016/0292587 | A1 | 10/2016 | Rigetti et al. |
| 2018/0137428 | A1 | 5/2018 | Abdo |
| 2018/0330265 | A1 | 11/2018 | Kelly |

FOREIGN PATENT DOCUMENTS

WO   WO 2018/063206 A1   4/2018

OTHER PUBLICATIONS

International search report and written opinion in related International Application No. PCT/US2020/016250, dated Apr. 28, 2020 (16 pages).

(Continued)

*Primary Examiner* — Dinh T Le
(74) *Attorney, Agent, or Firm* — Finnegan, Henderson, Farabow, Garrett & Dunner, LLP

(57) ABSTRACT

The present disclosure relates to a qubit measurement and control system (e.g., including a qubit calibration device) that may include: a qubit processing unit including circuitry configured to process one or more qubits, and an adjustable device disposed adjacent to the qubit processing unit. The adjustable device and the qubit processing unit may be within a same environment (e.g., the same temperature environment). For example, the qubit processing unit and the adjustable device being are on the same chip. The qubit measurement and control system may also include a control signal generator selectively connected to the qubit processing unit and the adjustable device. The control signal generator may be configured to generate a qubit control signal to be selectively transmitted to the qubit processing unit and the adjustable device.

15 Claims, 11 Drawing Sheets

(56) References Cited

OTHER PUBLICATIONS

European Patent Office Communication issued for Application No. 20749347.9 which encloses the extended European Search Report which includes pursuant to Rule 62 EPC, the Supplementary European Search Report (Art. 153(7) EPC) and the European search opinion, dated Mar. 2, 2022, 15 pages.

Hornibrook et al., "Cryogenic Control Architecture for Large-Scale Quantum Computing," arxiv. org, Cornell University Library, 8 pages (2014).

Kurpiers et al., "Characterizing the attenuation of coaxial and rectangular microwave-frequency waveguides at cryogenic temperatures," arxiv. org, Cornell University Library, 9 pages (2016).

Ranzani et al., "Two-port microwave calibration at Millikelvin temperatures," Review of Scientific Instruments, 84: 9 pages (2013).

Van Dijk et al., "The electronic interface for quantum processors," arxiv. org, Cornell University Library, 14 pages (2018).

\* cited by examiner

DEVICE, SYSTEM, AND METHOD FOR QUBIT CALIBRATION, MEASUREMENT AND CONTROL

CROSS REFERENCE TO RELATED APPLICATION

This disclosure claims the benefits of priority to Chinese application number 201910107886.2, filed Feb. 2, 2019, which is incorporated herein by reference in its entirety.

BACKGROUND

Quantum computing and quantum information are based on principles of quantum mechanics to perform computing and information processing. Quantum computing is an interdisciplinary subject that is closely related to multiple disciplines such as quantum physics, computer science, information science, etc. In the last two decades, quantum computing has developed rapidly. Quantum algorithms running on quantum computers have been applied in various fields, such as factorization, and unstructured search, and have demonstrated far more superior performance compared to classical algorithms performed on classical computers. As a result, quantum computing is expected to exceed the performance of conventional computing. But quantum computing requires calibration, measurement, and control to maintain precision of the information unit (e.g., qubits), which sometimes can be challenging.

SUMMARY OF THE DISCLOSURE

The present disclosure provides a qubit measurement and control system, comprising: a qubit processing unit including circuitry configured to process one or more qubits; an adjustable device disposed adjacent to the qubit processing unit, the adjustable device and the qubit processing unit being within a same environment; and a control signal generator selectively connected to the qubit processing unit and the adjustable device, the control signal generator being configured to generate a qubit control signal to be selectively transmitted to the qubit processing unit and the adjustable device.

According to some embodiments of the disclosure, the one or more qubits are based on a superconducting Josephson junction.

According to some embodiments of the disclosure, the qubit measurement and control system further includes a first mode selection device disposed on a first side of the qubit processing unit and the adjustable device, the first side being a side where the control signal generator is located.

According to some embodiments of the disclosure, the qubit measurement and control system further includes a second mode selection device disposed on a second side of the qubit processing unit and the adjustable device.

According to some embodiments of the disclosure, the qubit processing unit and the adjustable device are disposed on a same chip.

According to some embodiments of the disclosure, the qubit processing unit and the adjustable device are disposed on a same printed circuit board (PCB).

According to some embodiments of the disclosure, the qubit processing unit, the adjustable device, the first mode selection device and the second mode selection device are disposed on the same chip.

According to some embodiments of the disclosure, the qubit processing unit, the adjustable device, the first mode selection device and the second mode selection device are disposed on the same printed circuit board (PCB).

According to some embodiments of the disclosure, the qubit measurement and control system further includes at least one regulator disposed between the control signal generator and the qubit processing unit.

According to some embodiments of the disclosure, the qubit control signal includes a microwave signal or a laser signal.

According to some embodiments of the disclosure, the adjustable device receives the qubit control signal and generates a detection signal, the detection signal is fed back a control device, and the control device controls, at least according to the detection signal, the control signal generator to adjust the qubit control signal.

According to some embodiments of the disclosure, adjusting the qubit control signal by the control signal generator includes adjusting at least one of the parameters including phase, intensity, and frequency.

According to some embodiments of the disclosure, the first mode selection device and the second mode selection device are configured to implement: a plurality of control signal mode selections and control signal path selections respectively.

According to some embodiments of the disclosure, the control signal path mode selections include a reflection mode and a through mode.

According to some embodiments of the disclosure, the qubit processing unit and the adjustable device (e.g., on the chip or PCB) are disposed in a low-temperature environment, the low-temperature environment including a liquid helium temperature zone.

According to some embodiments of the disclosure, a qubit calibration device is provided, which includes: a qubit processing unit including circuitry configured to, after receiving a qubit control signal, process one or more qubits; and an adjustable device configured to, after receiving the qubit control signal, generate a detection signal used to further adjust the qubit control signal, the qubit processing unit and the adjustable device being disposed on a same substrate (e.g., a single chip or a PCB).

According to some embodiments, the one or more qubits are based on a superconducting Josephson junction.

According to some embodiments, the qubit calibration device further comprises: a first mode selection device located on one side of the qubit processing unit and disposed on the same substrate.

According to some embodiments, the qubit calibration device further comprises: a second mode selection device located on the other side of the qubit processing unit from the first mode selection device, and the second mode selection device being disposed on the same substrate.

According to some embodiments, the qubit control signal comprises a microwave signal or a laser signal.

According to some embodiments, the qubit control signal is adjusted by at least one of the parameters including phase, intensity, and frequency.

According to some embodiments, the substrate is disposed in a low-temperature environment comprising a liquid helium temperature zone.

According to some embodiments, the substrate is a single chip or a printed circuit board (PCB).

According to some embodiments, a qubit measurement and control method is provided, which includes: receiving a qubit control signal at an adjustable device; detecting, by the adjustable device, the qubit control signal, to obtain a detection signal, wherein the qubit control signal is adjusted based on a comparison between the detection signal and the qubit control signal.

According to some embodiments, the qubit control signal comprises a microwave signal or a laser signal.

According to some embodiments, the qubit control signal is adjusted by at least one of the following parameters: phase, intensity, and frequency.

According to some embodiments, the detection signal is transmitted to a control device via a reflection mode or a through mode.

BRIEF DESCRIPTION OF THE DRAWINGS

The drawings described herein are provided to provide a further understanding of the disclosure and constitute a part of the disclosure. The exemplary embodiments of the disclosure and description thereof are used to explain the disclosure, and do not constitute improper limitations to the disclosure. In the drawings.

DETAILED DESCRIPTION

When reading in conjunction with the drawings, the foregoing summary and the following detailed description of certain embodiments will be better understood. The schematic diagrams of functional blocks of some embodiments in the figures do not necessarily indicate the division between hardware circuits. Thus, for example, one or more of the functional blocks (e.g., a processor or a memory) may be implemented in a single piece of hardware (e.g., a signal processor or a random access memory, a hard disk, etc.) or a plurality of pieces of hardware. Similarly, the program may be a stand-alone program, may be combined into a routine in an operating system, or may be a function in an installed software package, etc. It should be understood that some embodiments are not limited to the arrangements and tools shown in the figures.

As used in the disclosure, the elements or steps described in a singular form or starting with "a" or "an" should be construed as that the plural of the elements or steps are not excluded unless such exclusion is explicitly stated. In addition, references to "one embodiment" are not intended to be construed as excluding the existence of additional embodiments that also incorporate the described features. Embodiments that "include," "comprise" or "have" an element or a plurality of elements having a particular attribute may include additional such elements that do not have that attribute, unless the contrary is explicitly stated.

One of the basic characteristics of a quantum computer is that the adopted information unit is not a classical binary bit, but a qubit (e.g., also referred to as a quantum bit, or a qbit). In some embodiments, qubits may include particles like electrons, or other quasi-particles in elementary excitation. For example, with regard to electrons, a spin-up state (e.g., electron spins clockwise on its axis) may represent 1, and in a spin-down state (e.g., electron spins counter-clockwise on its axis) may represent 0. Further, a quantum state with spins both up and down is called a superposition state. A small number of particles in the superposition state may carry a large amount of information. For example, 100 particles in the superposition state may represent 1 to 2100 digits. Accordingly, quantum computer may use microwave, laser pulses, or other suitable methods to manipulate (e.g., excite) particles to perform operations and computations with qubits.

Figure 1:
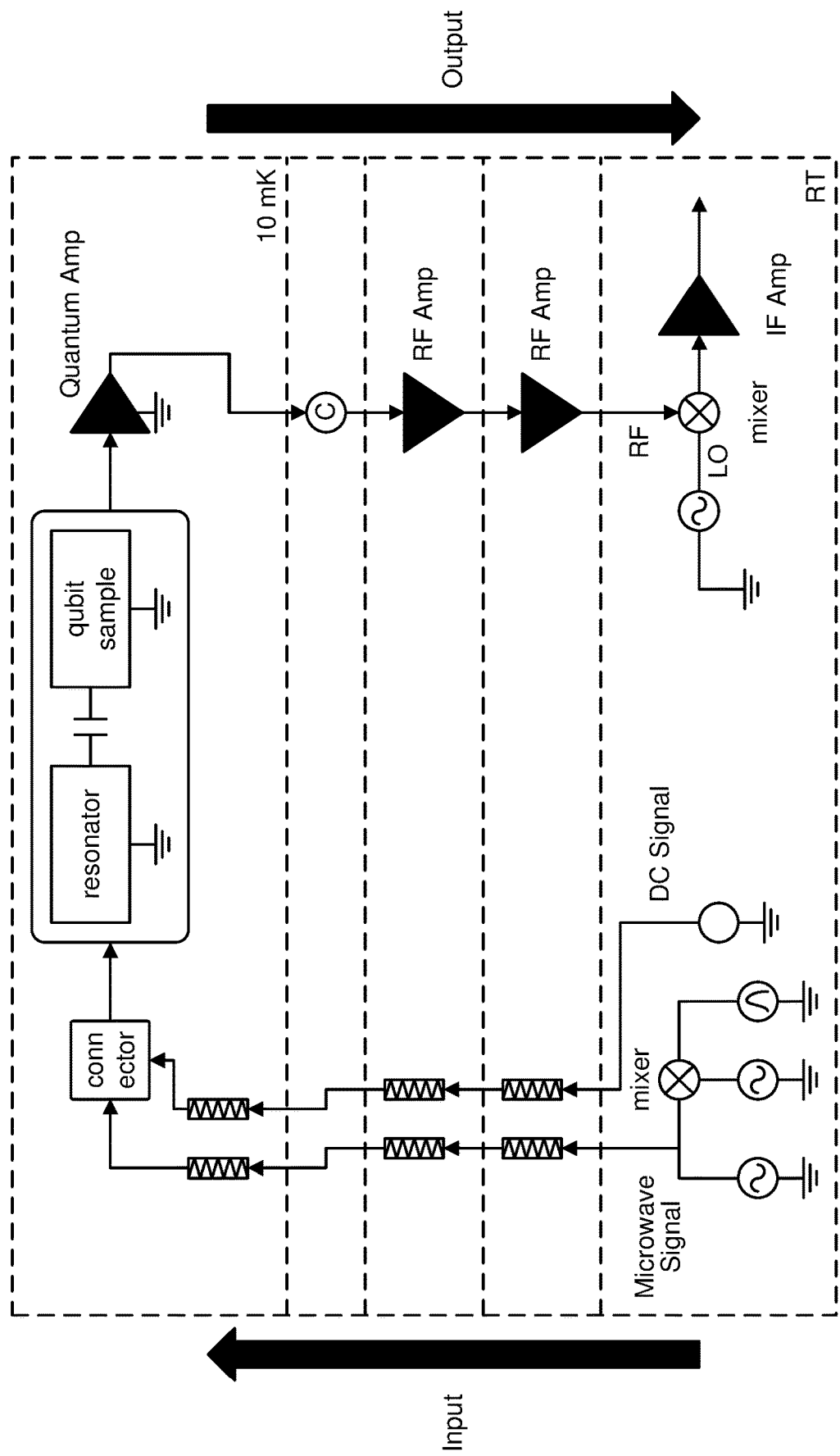
FIG. 1 is a schematic diagram of an example qubit measurement and control system, according to some embodiments of the present disclosure.

At present, implementations of qubits in quantum computing can be based on superconducting Josephson junctions, ion traps, magnetic resonance, topological quantum, etc. Further, one of the common and major implementations of qubits includes superconducting quantum computing based on Josephson junctions. A superconducting qubit chip needs to be kept in a low-temperature environment (e.g., typically a temperature zone to keep liquid helium) to maintain the superconductivity, and the low-temperature environment is usually provided by a dilution refrigerator. In some embodiments, an input control signal is transmitted to a superconducting qubit chip through a coaxial cable. However, as shown in FIG. 1, the input process may take a long distance, which may span a large temperature range. In addition, there may include a number of filters, attenuators, or adapters. These relatively complex environments, especially the low-temperature environment, may have a large impact on the control signal, which may further cause the control signal inputted into the superconducting qubit chip to be significantly different from expected. As a result, a precise control over the superconducting qubit may be limited, further making the actual implementations of the quantum computers more difficult.

The present disclosure overcomes these issues by providing a calibration device and a corresponding calibration method that support measurement and control of a qubit chip for improved precision.

Figure 2:
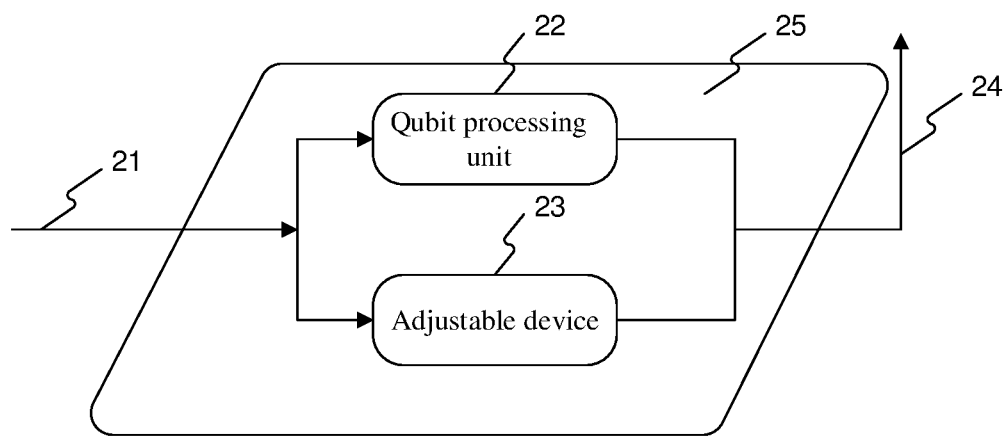
FIG. 2 is a schematic diagram of an example qubit calibration device, according to some embodiments of the present disclosure.

FIG. 2 illustrates a schematic diagram of an example qubit calibration device 200, according to some embodiments of the present disclosure. In some embodiments, a qubit processing unit 22 and an adjustable device 23 are disposed on a single chip 25. Single chip 25 may include a single wafer that is processed to provide qubit processing unit 22 and adjustable device 23.

In some embodiments, qubit processing unit 22 and adjustable device 23 are placed as close as possible so that they are placed in the same environment (e.g., within the same temperature range).

In some embodiments, qubit processing unit 22 includes a chip (or a unit module on a chip) including one or more qubits. For example, qubit processing unit 22 may include: a qubit (e.g., a small quantum-mechanical system), a resonator, circuitry configured to receive an input signal (e.g., input signal 21, may also be referred to as a qubit control signal) on the chip, and corresponding circuitry configured to amplify and output a qubit signal on the chip. Qubit processing unit 22 is configured to transform the quantum states of one or more qubits after receiving input signal 21. The output qubit signals are obtained by performing measurement on the qubits. Qubit processing unit 22 may be a quantum computing processor, or may be a modular quantum computing chip that includes a plurality of modules with one corresponding to a quantum computing processor. In some embodiments, adjustable device 23 includes a controllable switch and a plurality of standard devices for calibration. In some embodiments, the standard devices for calibration use standards such as Open\Short\Fixed Load\Thru, and input signal 21 may be calibrated based on these different standards.

In some embodiments, input signal 21 is transmitted using a coaxial cable. Input signal 21 may include a signal for controlling a qubit and may be generated by a control signal generator. For example, input signal 21 may include a microwave signal or a laser signal. Those skilled in the art can select any suitable control signal generator and select parameters, such as phase, intensity, and frequency, of input signal 21 according to the desired control over the qubit. The selected parameters may be simultaneously transmitted to a control device (e.g., may be control signal generator 105, a module of control signal generator 105, or control device 103 communicatively coupled to control signal generator 105, FIG. 10) for controlling (e.g., analyzing or adjusting) input signal 21 to provide more precise control of the qubit.

In some embodiments, the qubit is based on a superconducting Josephson junction.

In some embodiments, single chip 25 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 21 may be distorted when transmitted from a room temperature environment (or a relatively high-temperature region) to the low-temperature environment. For example, the parameters, such as phase, intensity and frequency, of input signal 21 may change. As a result, when input signal 21 is transmitted to qubit processing unit 22, the actual phase, intensity, frequency and other parameters will deviate from the corresponding preset values, thereby making the control process over the qubit more difficult, less accurate, or even uncontrollable.

In some embodiments, after arriving at chip 25, input signal 21 may be transmitted to qubit processing unit 22 to control the qubit, or may be transmitted to adjustable device 23 for calibration. Those skilled in the art will appreciate that selection of transmission of input signal 21 to qubit processing unit 22 or adjustable device 23 may be made by, for example, but not limited to, an automatic switching device prior to receiving input signal 21 for calibration of the qubit (e.g., at adjustable device 23) or control over the qubit (e.g., at qubit processing unit 22). When input signal 21 is transmitted to adjustable device 23, a detection signal 24 is obtained (e.g., from adjustable device 23). Since qubit processing unit 22 and adjustable device 23 are placed close to each other (e.g., in the same environment), input signal 21 arrived at adjustable device 23 may be substantially similar or identical to input signal 21 arrived at qubit processing unit 22.

Figure 10:
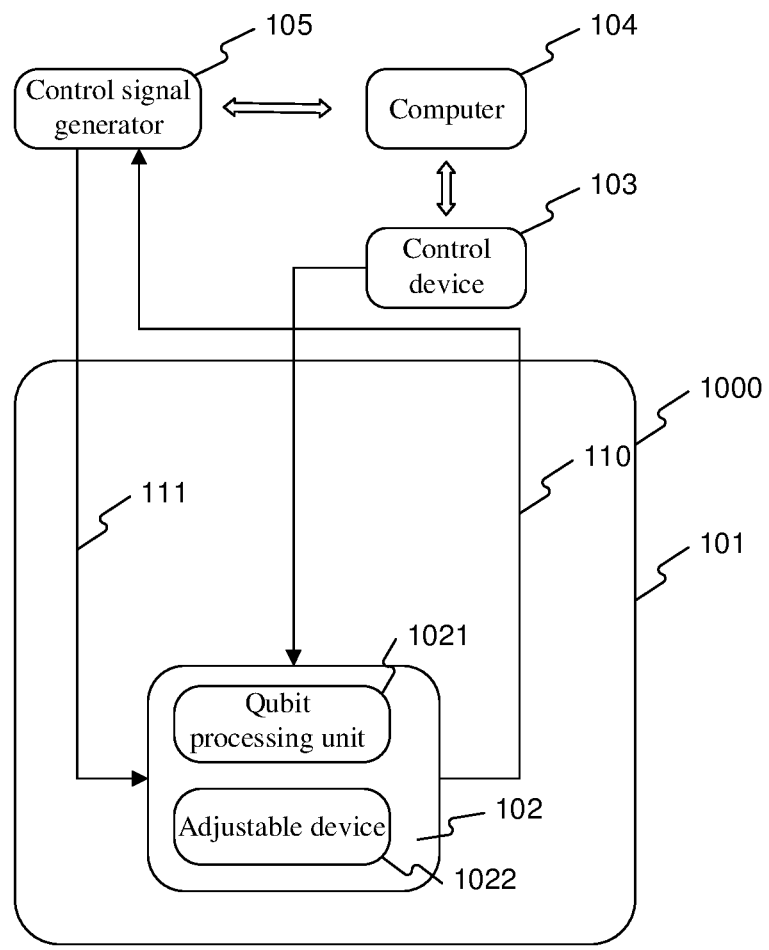
FIG. 10 is a schematic diagram of an example qubit measurement and control system, according to some embodiments of the present disclosure.

In some embodiments, detection signal 24 is further fed back to the control device (e.g., control signal generator 105 of FIG. 10, to provide information used to control or adjust input signal 21 transmitted to qubit processing unit 22 on chip 25 for more precise control of qubit). A feedback path of detection signal 24 may include different modes such as transmission "through," or via "reflection," or a combination thereof. In some embodiments, the control device obtains a degree of deviation between the signal actually arriving at adjustable device 23 and input signal 21 according to comparison between parameters of detection signal 24 and initial parameters of input signal 21. The obtained degree of deviation may be used to make corresponding adjustment to input signal 21 generated by the control signal generator (e.g., control signal generator 105, FIG. 10). In some examples, the adjustment may include adjustment to any one or more of the above-mentioned parameters, such as phase, intensity or frequency.

In some embodiments, the above process may be repeated multiple times until the degree of deviation reaches a preset range of convergence. In some examples, the preset range of convergence may include that a deviation between any parameter, e.g., phase, intensity or frequency, of detection signal 24 and the corresponding parameter of input signal 21 is less than a preset value. In some other examples, the preset range of convergence may include that the deviation of each of phase, intensity, and frequency between detection signal 24 and input signal 21 is less than a preset value. In yet some other examples, the preset range of convergence may include that the deviation between one or more set function values of phase, intensity, and frequency of detection signal 24 and the corresponding set function values of input signal 21 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 21 finally arrived at qubit processing unit 22 may satisfy preset parameter values (e.g., including phase, intensity, or frequency, etc.), so that the qubit can be more precisely controlled.

Figure 3:
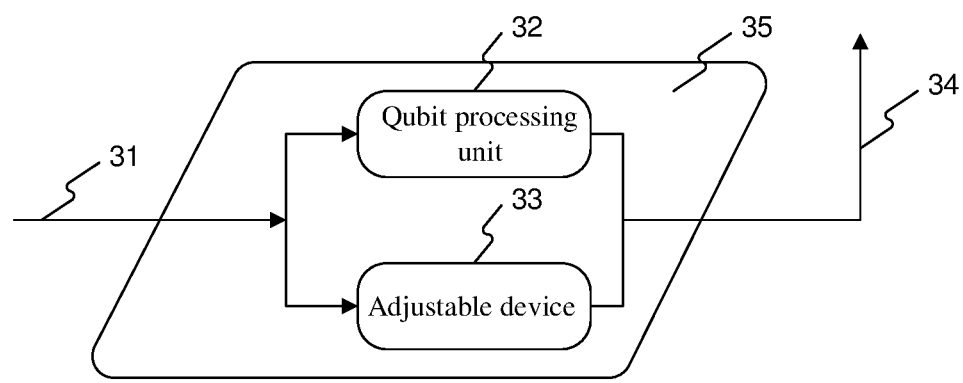
FIG. 3 is a schematic diagram of an example qubit calibration device, according to some embodiments of the present disclosure.

FIG. 3 illustrates a schematic diagram of an example qubit calibration device 300, according to some embodiments of the present disclosure. In some embodiments, a qubit processing unit 32 and an adjustable device 33 are disposed on a single printed circuit board (PCB) 35. The frame structure as illustrated in FIG. 3 may be simpler for the fabrication process than the structure illustrated in FIG. 2.

In some embodiments, qubit processing unit 32 and adjustable device 33 are placed as close as possible so that they are placed in the same environment (e.g., within the same temperature range).

In some embodiments, qubit processing unit 32 includes a PCB (or a unit module on a PCB) including one or more qubits. For example, qubit processing unit 32 and may include: a qubit (e.g., a small quantum-mechanical system), a resonator, circuitry configured to receive an input signal (e.g., input signal 31, may also be referred to as a qubit control signal), and corresponding circuitry configured to amplify and output a signal. In some embodiments, adjustable device 33 includes a controllable switch and a plurality of standard devices for calibration. In some embodiments, the standard devices for calibration use standards such as Open\Short\Fixed Load\Thru, and input signal 21 may be calibrated based on these different standards.

In some embodiments, input signal 31 is transmitted using a coaxial cable. Input signal 31 may include a signal for controlling a qubit and may be generated by a control signal generator. For example, input signal 31 may include a microwave signal or a laser signal. Those skilled in the art can select any suitable signal generator and select parameters, such as phase, intensity, and frequency, of input signal 31 according to the desired control over the qubit. The selected parameters may be simultaneously transmitted to a control device (e.g., may be control signal generator 105, a module of control signal generator 105, or control device 103 communicatively coupled to control signal generator 105, FIG. 10) for controlling (e.g., adjusting) input signal 31 to provide more precise control of the qubit.

In some embodiments, the qubit is based on a superconducting Josephson junction.

In some embodiments, single PCB 35 is placed in a low-temperature environment in use. the low-temperature environment may include a temperature range from 100 mK to 4.2 K (K refers to Kelvin). The low-temperature environment may be provided by, for example, but is not limited to, a dilution refrigerator. In some embodiments, input signal 31 may be distorted when transmitted from a room temperature environment (or a relatively high-temperature region) to the low-temperature environment. For example, the parameters, such as phase, intensity and frequency, of input signal 31 may change. As a result, when input signal 31 is transmitted to qubit processing unit 32, the actual phase, intensity, frequency and other parameters will deviate from the corresponding preset values, thereby making the control process over the qubit more difficult, less accurate, or even uncontrollable.

In some embodiments, after arrived at PCB 35, input signal 31 may be transmitted to qubit processing unit 32 to control the qubit, or may be transmitted to adjustable device 33 for calibration. Those skilled in the art will appreciate that selection of transmission of input signal 31 to qubit processing unit 32 or adjustable device 33 may be made by, for example, but not limited to, an automatic switching device prior to receiving input signal 31 for calibration of the qubit (e.g., at adjustable device 33) or control over the qubit (e.g., at qubit processing unit 32). When input signal 31 is transmitted to adjustable device 33, a detection signal 34 is obtained (e.g., from adjustable device 33). Since qubit processing unit 32 and adjustable device 33 are placed close to each other (e.g., in the same environment), input signal 31 arrived at adjustable device 33 may be substantially similar or identical to input signal 31 arriving at qubit processing unit 32.

In some embodiments, detection signal 34 is further fed back to the control device (e.g., control signal generator 105 of FIG. 10 to provide information used to control or adjust input signal 31 transmitted to qubit processing unit 32 on PCB 35 for more precise control of qubit). A feedback path of detection signal 34 may include transmission "through," or via "reflection," or a combination thereof. In some embodiments, the control device obtains a degree of deviation between the signal actually arrived at adjustable device 33 and input signal 31 according to comparison between parameters of detection signal 34 and initial parameters of input signal 31. The obtained degree of deviation may be used to make corresponding adjustment to input signal 31 generated by the control signal generator (e.g., control signal generator 105, FIG. 10). In some examples, the adjustment may include adjustment to any one or more of the above-mentioned parameters, such as phase, intensity or frequency.

In some embodiments, the above process may be repeated multiple times until the degree of deviation reaches a preset range of convergence. In some examples, the preset range of convergence may include that a deviation between any parameter, e.g., phase, intensity, or frequency, of detection signal 34 and the corresponding parameter of input signal 31 is less than a preset value. In some other examples, the preset range of convergence may include that the deviation of each of phase, intensity and frequency between detection signal 34 and input signal 31 is less than a preset value. In yet some other examples, the preset range of convergence may include that the deviation between one or more set function values of phase, intensity and frequency of detection signal 34 and the corresponding set function values of input signal 31 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 31 finally arrived at qubit processing unit 32 may satisfy preset parameter values (e.g., including phase, intensity, or frequency, etc.), so that the qubit can be more precisely controlled.

Figure 4:
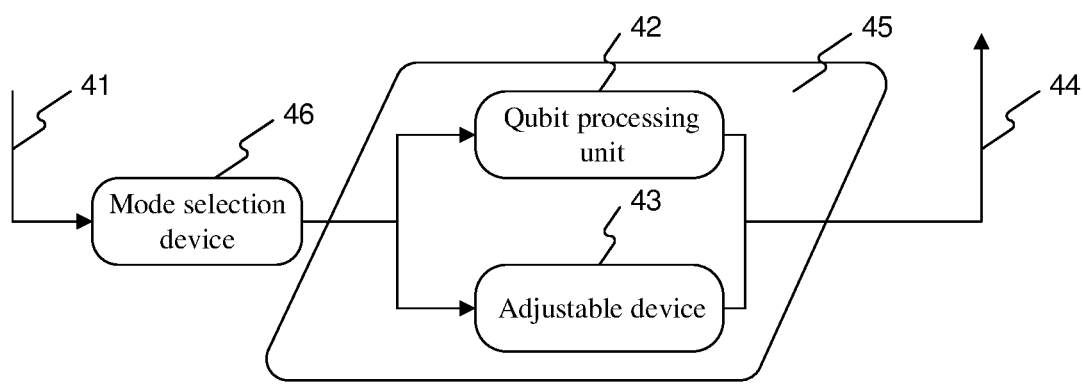
FIG. 4 is a schematic diagram of an example qubit calibration device, according to some embodiments of the present disclosure.

FIG. 4 illustrates a schematic diagram of an example qubit calibration device 400, according to some embodiments of the present disclosure. In some embodiments, a qubit processing unit 42 and an adjustable device 43 are disposed on a single chip 45. Single chip 45 may include a single wafer that is processed to provide qubit processing unit 42 and adjustable device 43. In some embodiments, qubit calibration device 400 further includes a mode selection device 46. Mode selection device 46 may change a path of an input signal 41 via remote controlling (e.g., based on, but not limited to, electrical signals). In some examples, if a mode of transmitting input signal 41 to qubit processing unit 42 is selected, the qubit is controlled. In some other examples, if a mode of transmitting input signal 41 to adjustable device 43 is selected, calibration (e.g., of input signal 41) may be performed. In some embodiments, mode selection device 46 is disposed at input signal 41 side (e.g., prior to input signal 41 arriving at qubit processing unit 42 or adjustable device 43 on single chip 45).

In some embodiments, qubit processing unit 42 and adjustable device 43 are placed as close as possible so that they are placed in the same environment (e.g., within the same temperature range). In some embodiments, the electrical wires and circuitry connecting mode selection device 46 and qubit processing unit 42 have substantially similar microwave-responsive characteristics as the electrical wires and circuitry between mode selection device 46 and adjustable device 43.

In some embodiments, qubit processing unit 42 includes a chip (or a unit module on a chip) including one or more qubits. For example, qubit processing unit 22 may include: a qubit (e.g., a small quantum-mechanical system), a resonator, circuitry configured to receive an input signal (e.g., input signal 41, may also be referred to as a qubit control signal), and corresponding circuitry configured to amplify and output a signal. In some embodiments, adjustable device 43 includes a controllable switch and a plurality of standard devices for calibration. In some embodiments, the standard devices for calibration use standards such as Open\Short\Fixed Load\Thru, and input signal 41 may be calibrated based on these different standards. In some embodiments as discussed in the present disclosure, by performing calibration at adjustable device 43, a to-be-controlled qubit signal (e.g., qubit signal 111 controlled and adjusted by qubit signal generator 105 in view of feedback information detected from detection signal as discussed with reference to FIG. 10) arrived at qubit processing unit 42 can better meet the requirements.

In some embodiments, input signal 41 is transmitted using a coaxial cable. Input signal 41 may include a signal for controlling a qubit and may be generated by a control signal generator. For example, input signal 41 may include a microwave signal or a laser signal. Those skilled in the art can select any suitable signal generator and select parameters, such as phase, intensity, and frequency, of input signal 41 according to the desired control over the qubit. The selected parameters may be simultaneously transmitted to a control device (e.g., may be control signal generator 105, a module of control signal generator 105, or control device 103 communicatively coupled to control signal generator 105, or control device 103, FIG. 10) for controlling (e.g., adjusting) input signal 41 to provide more precise control of the qubit.

In some embodiments, the qubit is based on a superconducting Josephson junction.

In some embodiments, single chip 45 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 41 may be distorted when transmitted from a room temperature environment (or a relatively high-temperature region) to the low-temperature environment. For example, the parameters, such as phase, intensity, and frequency, of input signal 41 may change. As a result, when input signal 41 is transmitted to qubit processing unit 42, the actual phase, intensity, frequency and other parameters will deviate from the corresponding preset values, thereby making the control process over the qubit more difficult, less accurate, or even uncontrollable.

In some embodiments, input signal 41 may be inputted to qubit processing unit 42 via mode selection device 46 to control the qubit or may be inputted to adjustable device 43 for calibration. When input signal 41 is inputted to adjustable device 43, a detection signal 44 is obtained. Since qubit processing unit 42 and adjustable device 43 are placed close to each other (e.g., in the same environment), input signal 41 arrived at adjustable device 43 may be substantially similar or identical to input signal 41 arrived at qubit processing unit 42.

In some embodiments, detection signal 44 is further fed back to the control device (e.g., control signal generator 105 of FIG. 10, to provide information used to control or adjust input signal 41 transmitted to qubit processing unit 42 on chip 45 for more precise control of qubit). A feedback path of detection signal 44 may include transmission "through," or via "reflection," or a combination thereof. In some embodiments, the control device obtains a degree of deviation between the signal actually arrived at adjustable device 43 and input signal 41 according to comparison between parameters of detection signal 44 and initial parameters of input signal 41. The obtained degree of deviation may be used to make corresponding adjustment to input signal 41 generated by the control signal generator (e.g., control signal generator 105, FIG. 10). In some examples, the adjustment may include adjustment to any one or more of the above-mentioned parameters, such as phase, intensity, or frequency.

In some embodiments, the above process may be repeated multiple times until the degree of deviation reaches a preset range of convergence. In some examples, the preset range of convergence may include that a deviation between any parameter, e.g., phase, intensity, or frequency, of detection signal 44 and the corresponding parameter of input signal 41 is less than a preset value. In some other examples, the preset range of convergence may include that the deviation of each of phase, intensity, and frequency between detection signal 44 and input signal 41 is less than a preset value. In yet some other examples, the preset range of convergence may include that the deviation between one or more set function values of phase, intensity, and frequency of detection signal 44 and the corresponding set function values of input signal 41 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 41 finally arriving at qubit processing unit 42 may satisfy preset parameter values (e.g., including phase, intensity, or frequency, etc.), so that the qubit can be more precisely controlled.

Figure 5:
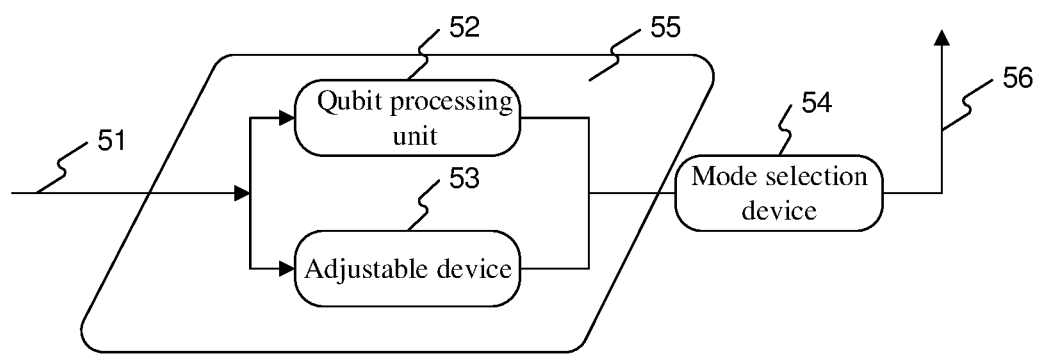
FIG. 5 is a schematic diagram of an example qubit calibration device, according to some embodiments of the present disclosure.

FIG. 5 illustrates a schematic diagram of an example qubit calibration device 500, according to some embodiments of the present disclosure. In some embodiments, a qubit processing unit 52 and an adjustable device 53 are disposed on a single chip 55. Single chip may include a single wafer that is processed to provide qubit processing unit 52 and adjustable device 53 (e.g., an adjustable microwave standard responder device 53). In some embodiments, qubit calibration device 500 further includes a mode selection device 54. Mode selection device 54 may change a path of the input signal 51 via remote controlling (e.g., based on, but not limited to, electrical signals). If a mode of inputting to qubit processing unit 52 is selected, the qubit is controlled. If a mode of inputting to adjustable device 53 is selected, the step of calibration may be performed. In some embodiments, mode selection device 54 is disposed at a detection signal 56 side.

In some embodiments, qubit processing unit 52 and adjustable device 53 are placed as close as possible so that they are placed in the same environment (e.g., within the same temperature range).

In some embodiments, qubit processing unit 52 includes a chip (or a unit module on a chip) including one or more qubits. For example, qubit processing unit 22 may include: a qubit (e.g., a small quantum-mechanical system), a resonator, circuitry configured to receive an input signal (e.g., input signal 51, may also be referred to as a qubit control signal), and corresponding circuitry configured to amplify and output a signal. In some embodiments, adjustable device 53 includes a controllable switch and a plurality of standard devices for calibration. In some embodiments, the standard devices for calibration use standards such as Open\Short\Fixed Load\Thru, and input signal 51 may be calibrated based on these different standards.

In some embodiments, input signal 51 is transmitted using a coaxial cable. Input signal 51 may include a signal for controlling a qubit and may be generated by a control signal generator. For example, the input signal 51 may include a microwave signal or a laser signal. Those skilled in the art can select any suitable control signal generator and select parameters, such as phase, intensity, and frequency, of input signal 51 according to the desired control over the qubit. The selected parameters may be simultaneously transmitted to a control device (e.g., may be control signal generator 105, a module of control signal generator 105, or control device 103 communicatively coupled to control signal generator 105, FIG. 10) for controlling (e.g., adjusting) input signal 51 to provide more precise control of the qubit.

In some embodiments, the qubit is based on a superconducting Josephson junction.

In some embodiments, single chip 55 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 51 may be distorted when transmitted from a room temperature environment (or a relatively high-temperature region) to the low-temperature environment. For example, the parameters, such as phase, intensity, and frequency, of input signal 51 may change. As a result, when input signal 51 is transmitted to qubit processing unit 52, the actual phase, intensity, frequency and other parameters will deviate from the corresponding preset values, thereby making the control process over the qubit more difficult, less accurate, or even uncontrollable.

In some embodiments, input signal 51 may be inputted to qubit processing unit 52 to control the qubit or may be inputted to adjustable device 53 for calibration. When input signal 51 is inputted to adjustable device 53, a detection signal 56 is obtained. Since qubit processing unit 52 and adjustable device 53 are placed close to each other (e.g., in the same environment), input signal 51 arrived at adjustable microwave standard responder device 53 may be substantially similar or identical to input signal 51 arrived at qubit processing unit 52.

In some embodiments, detection signal 56 is further fed back to the control device (e.g., to provide information used to control or adjust input signal 51 transmitted to qubit processing unit 52 on chip 55 for more precise control of qubit) via mode selection device 54. A feedback path of detection signal 56 may include transmission "through," or via "reflection," or a combination thereof. In some embodiments, the control device obtains a degree of deviation between the signal actually arrived at adjustable device 53 and input signal 51 according to comparison between parameters of detection signal 56 and initial parameters of input signal 51. The obtained degree of deviation may be used to make corresponding adjustment to input signal 51 generated by the control signal generator (e.g., control signal generator 105, FIG. 10). In some examples, the adjustment may include adjustment to any one or more of the above-mentioned parameters, such as phase, intensity, or frequency.

In some embodiments, the above process may be repeated multiple times until the degree of deviation reaches a preset range of convergence. In some examples, the preset range of convergence may include that a deviation between any parameter, e.g., phase, intensity, or frequency, of detection signal 56 and the corresponding parameter of input signal 51 is less than a preset value. In some other examples, the preset range of convergence may include that the deviation of each of phase, intensity, and frequency between detection signal 56 and input signal 51 is less than a preset value. In yet some other examples, the preset range of convergence may include that the deviation between one or more set function values of phase, intensity, and frequency of detection signal 56 and the corresponding set function values of input signal 51 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 51 finally arriving at qubit processing unit 52 may satisfy preset parameter values (e.g., including phase, intensity, or frequency, etc.), so that the qubit can be more precisely controlled.

Figure 6:
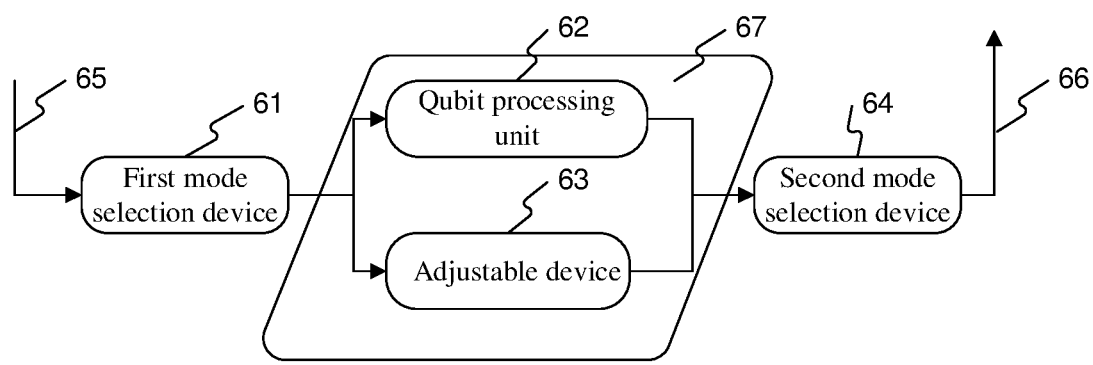
FIG. 6 is a schematic diagram of an example qubit calibration device, according to some embodiments of the present disclosure.

FIG. 6 illustrates a schematic diagram of an example qubit calibration device 600, according to some embodiments of the present disclosure. In some embodiments, a qubit processing unit 62 and an adjustable device 63 are disposed on a single chip 67. Single chip 67 may include a single wafer that is processed to provide qubit processing unit 62 and adjustable device 63. In some embodiments, qubit calibration device 600 further includes a first mode selection device 61 (e.g., disposed at input signal side) and a second mode selection device 64 (e.g., disposed at detection signal side). The mode selection device 61 or 64 may change a path of input signal 65 by remote controlling (e.g., based on, but not limited to, electrical signals). In some examples, if a mode of transmitting input signal 65 to qubit processing unit 62 is selected, the qubit is controlled. In some other examples, if a mode of transmitting input signal 65 to adjustable device 63 is selected, calibration (e.g., of input signal 65) may be performed. In some embodiments as shown in FIG. 6, first mode selection device 61 is disposed on one side of single chip 67, and second mode selection device 64 is disposed on the other side of single chip 67.

In some embodiments, qubit processing unit 62 and adjustable device 63 are placed as close as possible so that they are placed in the same environment (e.g., within the same temperature range). In some embodiments, the electrical wires and circuitry connecting first mode selection device 61 and qubit processing unit 62 have substantially similar microwave-responsive characteristics as the electrical wires and circuitry between first mode selection device 61 and adjustable device 63.

In some embodiments, qubit processing unit 62 includes a chip (or a unit module on a chip) including one or more qubits. For example, qubit processing unit 22 may include: a qubit (e.g., a small quantum-mechanical system), a resonator, circuitry configured to receive an input signal (e.g., input signal 65, may also be referred to as a qubit control signal), and corresponding circuitry configured to amplify and output a signal. In some embodiments, adjustable device 63 includes a controllable switch and a plurality of standard devices for calibration. In some embodiments, the standard devices for calibration use standards such as Open\Short\Fixed Load\Thru, and input signal 61 may be calibrated based on these different standards.

In some embodiments, input signal 65 is transmitted using a coaxial cable. Input signal 65 may include a signal for controlling a qubit and may be generated by a control signal generator. For example, input signal 65 may include a microwave signal or a laser signal. Those skilled in the art can select any suitable signal generator and select parameters, such as phase, intensity, and frequency, of input signal 65 according to the desired control over the qubit. The selected parameters may be simultaneously transmitted to a control device (e.g., control signal generator 105, a module of control signal generator 105, or control device 103 communicatively coupled to control signal generator 105, FIG. 10) for controlling (e.g., adjusting) input signal 65 to provide more precise control of the qubit.

In some embodiments, the qubit is based on a superconducting Josephson junction.

In some embodiments, single chip 67 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 65 may be distorted when transmitted from a room temperature environment (or a relatively high-temperature region) to the low-temperature environment. For example, the parameters, such as phase, intensity, and frequency, of input signal 65 may change. As a result, when input signal 65 is transmitted to qubit processing unit 62, the actual phase, intensity, frequency and other parameters will deviate from the corresponding preset values, thereby making the control process over the qubit more difficult, less accurate, or even uncontrollable.

In some embodiments, input signal 65 may be inputted to qubit processing unit 62 via first mode selection device 61 to control the qubit or may be inputted to adjustable device 63 for calibration. When input signal 65 is inputted to adjustable device 63, detection signal 66 is obtained. Since qubit processing unit 62 and adjustable device 63 are placed close to each other (e.g., in the same environment), input signal 65 arrived at adjustable device 63 may be substantially similar or identical to input signal 65 arrived at qubit processing unit 62.

In some embodiments, detection signal 66 is further fed back to the control device (e.g., to provide information used to control or adjust input signal 65 transmitted to qubit processing unit 62 on chip 67 for more precise control of qubit) via second mode selection device 64. A feedback path of detection signal 66 may include transmission "through," or via "reflection," or a combination thereof. In some embodiments, the control device obtains a degree of deviation between the signal actually arrived at adjustable device 63 and input signal 65 according to comparison between parameters of detection signal 66 and initial parameters of input signal 65. The obtained degree of deviation may be used to make corresponding adjustment to input signal 65 generated by the control signal generator (e.g., control signal generator 105, FIG. 10). In some examples, the adjustment may include adjustment to any one or more of the above-mentioned parameters, such as phase, intensity, or frequency.

In some embodiments, the above process may be repeated multiple times until the degree of deviation reaches a preset range of convergence. In some examples, the preset range of convergence may include that a deviation between any parameter, e.g., phase, intensity, or frequency, of detection signal 66 and the corresponding parameter of input signal 65 is less than a preset value. In some other examples, the preset range of convergence may include that the deviation of each of phase, intensity, and frequency between detection signal 66 and input signal 65 is less than a preset value. In yet some other examples, the preset range of convergence may include that the deviation between one or more set function values of phase, intensity, and frequency of detection signal 66 and the corresponding set function values of input signal 65 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 65 finally arriving at qubit processing unit 62 may satisfy preset parameter values (e.g., including phase, intensity, or frequency, etc.), so that the qubit can be more precisely controlled.

Figure 7:
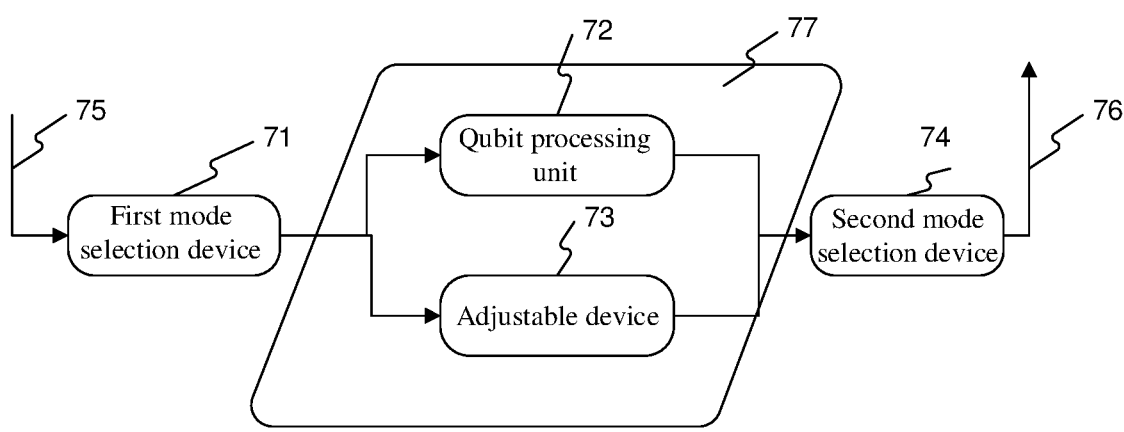
FIG. 7 is a schematic diagram of an example qubit calibration device, according to some embodiments of the present disclosure.

FIG. 7 illustrates a schematic diagram of an example qubit calibration device 700, according to some embodiments of the present disclosure. In some embodiments, a qubit processing unit 72 and an adjustable device 73 are disposed on a single PCB 77. Qubit calibration device 700 may further include a first mode selection device 71 and a second mode selection device 74. The mode selection device 71 or 74 may change a path of input signal 75 by remote controlling (e.g., based on, but not limited to, electrical signals). In some examples, if a mode of transmitting input signal 75 to qubit processing unit 72 is selected, the qubit is controlled. In some other examples, if a mode of transmitting input signal 75 to adjustable device 73 is selected, calibration (e.g., of input signal 75) may be performed. In some embodiments as shown in FIG. 7, first mode selection device 71 is disposed on one side of a single circuit board 77 (e.g., prior to input signal 75 entering PCB 77), and second mode selection device 74 is disposed on the other side of a single circuit board 77 (e.g., after obtaining detection signal 76 from PCB 77).

In some embodiments, qubit processing unit 72 and adjustable device 73 are placed as close as possible so that they are placed in the same environment (e.g., within the same temperature range). In some embodiments, the electrical wires and circuitry connecting first mode selection device 71 and qubit processing unit 72 have substantially similar microwave-responsive characteristics as the electrical wires and circuitry between first mode selection device 71 and adjustable device 73.

In some embodiments, qubit processing unit 72 includes a chip (or a unit module on a chip) including one or more qubits. For example, qubit processing unit 72 may include: a qubit (e.g., a small quantum-mechanical system), a resonator, circuitry configured to receive an input signal (e.g., input signal 75, may also be referred to as a qubit control signal), and corresponding circuitry configured to amplify and output a signal. In some embodiments, adjustable device 73 includes a controllable switch and a plurality of standard devices for calibration. In some embodiments, the standard devices for calibration use standards such as Open\Short\Fixed Load\Thru, and input signal 21 may be calibrated based on these different standards.

In some embodiments, input signal 75 is transmitted using a coaxial cable. Input signal 75 may include a signal for controlling a qubit and may be generated by a control signal generator. For example, input signal 75 may include a microwave signal or a laser signal. Those skilled in the art can select any suitable signal generator and select parameters, such as phase, intensity, and frequency, of input signal 75 according to the desired control over the qubit. The selected parameters may be simultaneously transmitted to a control device (e.g., control signal generator 105, a module of control signal generator 105, or control device 103 communicatively coupled to control signal generator 105, FIG. 10) for controlling (e.g., adjusting) input signal 75 to provide more precise control of the qubit.

In some embodiments, the qubit is based on a superconducting Josephson junction.

In some embodiments, PCB 77 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 75 may be distorted when transmitted from a room temperature environment (or a relatively high-temperature region) to the low-temperature environment. For example, the parameters, such as phase, intensity, and frequency, of input signal 75, may change. As a result, when input signal 75 is transmitted to qubit processing unit 72, the actual phase, intensity, frequency and other parameters will deviate from the corresponding preset values, thereby making the control process over the qubit more difficult, less accurate, or even uncontrollable.

In some embodiments, input signal 75 may be inputted to qubit processing unit 72 via first mode selection device 71 to control the qubit or may be inputted to adjustable device 73 for calibration. When input signal 75 is inputted to adjustable device 73, detection signal 76 is obtained. Since qubit processing unit 72 and adjustable device 73 are placed close to each other (e.g., in the same environment), input signal 75 arrived at adjustable device 73 may be substantially similar or identical to input signal 75 arrived at qubit processing unit 72.

In some embodiments, detection signal 76 is further fed back to the control device (e.g., to provide information used to control or adjust input signal 75 transmitted to qubit processing unit 72 on PCB 77 for more precise control of qubit) via second mode selection device 74. A feedback path of detection signal 76 may include transmission "through," or via "reflection," or a combination thereof. In some embodiments, the control device obtains a degree of deviation between the signal actually arrived at adjustable device 73 and input signal 75 according to comparison between parameters of detection signal 76 and initial parameters of input signal 75. The obtained degree of deviation may be used to make corresponding adjustment to input signal 75 generated by the control signal generator (e.g., control signal generator 105, FIG. 10). In some examples, the adjustment may include adjustment to any one or more of the above-mentioned parameters, such as phase, intensity, or frequency.

In some embodiments, the above process may be repeated multiple times until the degree of deviation reaches a preset range of convergence. In some examples, the preset range of convergence may include that a deviation between any parameter, e.g., phase, intensity, or frequency, of detection signal 76 and the corresponding parameter of input signal 75 is less than a preset value. In some other examples, the preset range of convergence may include that the deviation of each of phase, intensity, and frequency between detection signal 76 and input signal 75 is less than a preset value. In yet some other examples, the preset range of convergence may include that the deviation between one or more set function values of phase, intensity, and frequency of detection signal 76 and the corresponding set function values of input signal 75 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 75 finally arriving at qubit processing unit 72 may satisfy preset parameter values (e.g., including phase, intensity, or frequency, etc.), so that the qubit can be more precisely controlled.

Figure 8:
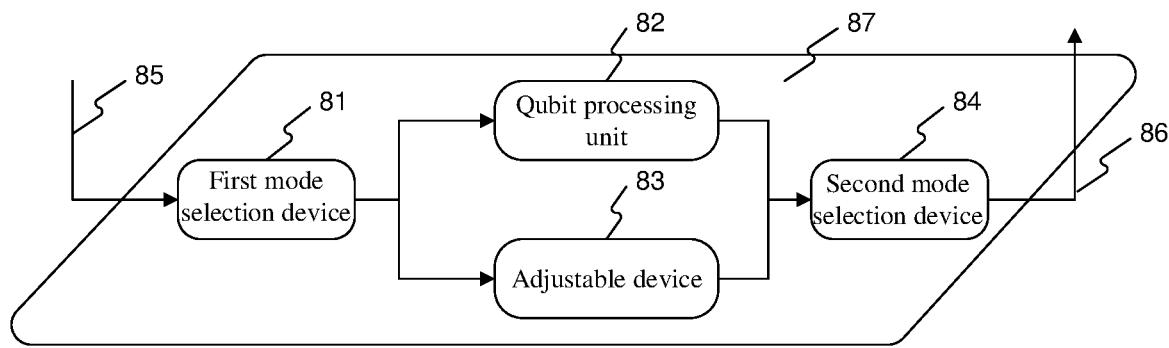
FIG. 8 is a schematic diagram of an example qubit calibration device, according to some embodiments of the present disclosure.

FIG. 8 illustrates a schematic diagram of an example qubit calibration device 800, according to some embodiments of the present disclosure. In some embodiments, a qubit processing unit 82 and an adjustable device 83 are disposed on a single chip 87. Single chip 87 may include a single wafer that is processed to provide qubit processing unit 82 and adjustable device 83. Qubit calibration device 800 may further include a first mode selection device 81 and a second mode selection device 84. The mode selection device 81 or 84 may change a path of input signal 85 by remote controlling (e.g., based on, but not limited to, electrical signals). In some examples, if a mode of transmitting input signal 85 to qubit processing unit 82 is selected, the qubit is controlled. In some other examples, if a mode of transmitting input signal 85 to adjustable device 83 is selected, calibration (e.g., of input signal 85) may be performed. In some embodiments, first mode selection device 81 and second mode selection device 84 are disposed on the same chip 87 as qubit processing unit 82 and adjustable device 83 as shown in FIG. 8. Further, first mode selection device 81 is disposed on one side of qubit processing unit 82 and adjustable device 83 (e.g., prior to input signal 85 entering qubit processing unit 82 or adjustable device 83), and second mode selection device 84 is disposed on the other side of qubit processing unit 82 and adjustable device 83 (e.g., after obtaining a detection signal 86 from adjustable device 83).

In some embodiments, qubit processing unit 82 and adjustable device 83 are placed as close as possible so that they are placed in the same environment (e.g., within the same temperature range). In some embodiments, the electrical wires and circuitry connecting first mode selection device 81 and qubit processing unit 82 have substantially similar microwave-responsive characteristics as the electrical wires and circuitry between first mode selection device 81 and adjustable device 83.

In some embodiments, qubit processing unit 82 includes a chip (or a unit module on a chip) including one or more qubits. For example, qubit processing unit 82 may include: a qubit (e.g., a small quantum-mechanical system), a resonator, circuitry configured to receive an input signal (e.g., input signal 85, may also be referred to as a qubit control signal), and corresponding circuitry configured to amplify and output a signal. In some embodiments, adjustable device 83 includes a controllable switch and a plurality of standard devices for calibration. In some embodiments, the standard devices for calibration use standards such as Open\Short\Fixed Load\Thru, and input signal 21 may be calibrated based on these different standards.

In some embodiments, input signal 85 is transmitted using a coaxial cable. Input signal 85 may include a signal for controlling a qubit and may be generated by a control signal generator. For example, input signal 85 may include a microwave signal or a laser signal. Those skilled in the art can select any suitable signal generator and select parameters, such as phase, intensity, and frequency, of input signal 85 according to the desired control over the qubit. The selected parameters may be simultaneously transmitted to a control device (e.g., control signal generator 105, a module of control signal generator 105, or control device 103 communicatively coupled to control signal generator 105, FIG. 10) for controlling (e.g., adjusting) input signal 85 to provide more precise control of the qubit.

In some embodiments, the qubit is based on a superconducting Josephson junction.

In some embodiments, single chip 87 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 85 may be distorted when transmitted from a room temperature environment (or a relatively high-temperature region) to the low-temperature environment. For example, the parameters, such as phase, intensity, and frequency, of input signal 85, may change. As a result, when input signal 85 is transmitted to qubit processing unit 82, the actual phase, intensity, frequency and other parameters will deviate from the corresponding preset values, thereby making the control process over the qubit more difficult, less accurate, or even uncontrollable.

In some embodiments, input signal 85 may be inputted to qubit processing unit 82 via first mode selection device 81 to control the qubit or may be inputted to adjustable device 83 for calibration. When input signal 81 is inputted to adjustable device 83, detection signal 86 is obtained. Since qubit processing unit 82 and adjustable device 83 are placed close to each other (e.g., in the same environment), input signal 85 arrived at adjustable device 83 may be substantially similar or identical to input signal 85 arrived at qubit processing unit 82.

In some embodiments, detection signal 86 is further fed back to the control device (e.g., to provide information used to control or adjust input signal 85 transmitted to qubit processing unit 82 on chip 87 for more precise control of qubit) via second mode selection device 84. A feedback path of detection signal 86 may include transmission "through," or via "reflection," or a combination thereof. In some embodiments, the control device obtains a degree of deviation between the signal actually arrived at adjustable device 83 and input signal 85 according to comparison between parameters of detection signal 86 and initial parameters of input signal 85. The obtained degree of deviation may be used to make corresponding adjustment to input signal 85 generated by the control signal generator (e.g., control signal generator 105, FIG. 10). In some examples, the adjustment may include adjustment to any one or more of the above-mentioned parameters, such as phase, intensity, or frequency.

In some embodiments, the above process may be repeated multiple times until the degree of deviation reaches a preset range of convergence. In some examples, the preset range of convergence may include that deviation between any parameter, e.g., phase, intensity, or frequency, of detection signal 86 and the corresponding parameter of input signal 85 is less than a preset value. In some other examples, the preset range of convergence may include that the deviation of each of phase, intensity, and frequency between detection signal 86 and input signal 85 is less than a preset value. In yet some other examples, the preset range of convergence may include that the deviation between one or more set function values of phase, intensity, and frequency of detection signal 86 and the corresponding set function values of input signal 85 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 85 finally arriving at qubit processing unit 82 may satisfy preset parameter values (e.g., including phase, intensity, or frequency, etc.), so that the qubit can be more precisely controlled.

Figure 9:
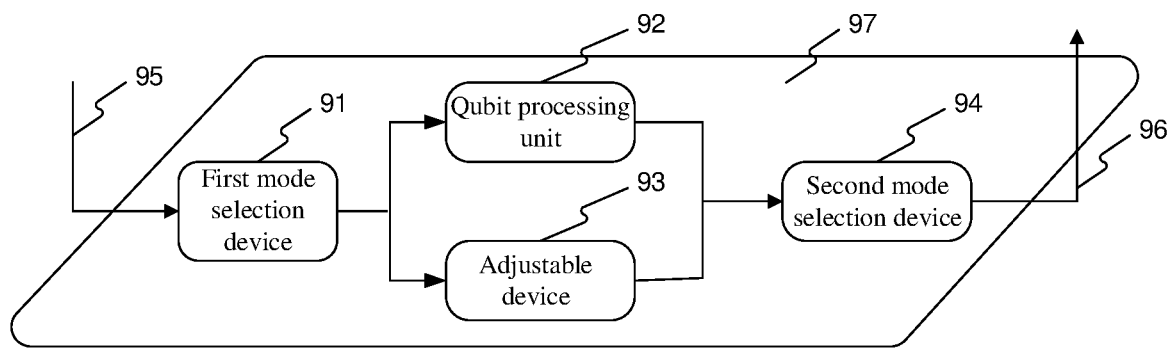
FIG. 9 is a schematic diagram of an example qubit calibration device, according to some embodiments of the present disclosure.

FIG. 9 illustrates a schematic diagram of an example qubit calibration device 900, according to some embodiments of the present disclosure. In some embodiments, a qubit processing unit 92 and an adjustable device 93 are disposed on a single PCB 97. Qubit calibration device 900 may further include a first mode selection device 91 and a second mode selection device 94. The mode selection device 91 or 94 may change a path of input signal 95 by remote controlling (e.g., based on, but not limited to, electrical signals). In some examples, if a mode of transmitting input signal 95 to qubit processing unit 92 is selected, the qubit is controlled. In some other examples, if a mode of transmitting input signal 95 to adjustable device 93 is selected, calibration (e.g., of input signal 95) may be performed. In some embodiments, first mode selection device 91 and second mode selection device 94 are disposed on the same PCB 97 as qubit processing unit 92 and adjustable device 93 as shown in FIG. 9. Further, first mode selection device 91 is disposed on one side of qubit processing unit 92 and adjustable device 93 (e.g., prior to input signal 95 entering qubit processing unit 92 or adjustable device 93), and second mode selection device 94 is disposed on the other side of qubit processing unit 92 and adjustable device 93 (e.g., after obtaining a detection signal 96 from adjustable device 93).

In some embodiments, qubit processing unit 92 and the adjustable device 93 are placed as close as possible so that they are placed in the same environment (e.g., within the same temperature range). In some embodiments, the electrical wires and circuitry connecting first mode selection device 91 and qubit processing unit 92 have substantially similar microwave-responsive characteristics as the electrical wires and circuitry between first mode selection device 91 and adjustable device 93.

In some embodiments, qubit processing unit 92 includes a chip (or a unit module on a chip) including one or more qubits. For example, qubit processing unit 82 may include: a qubit (e.g., a small quantum-mechanical system), a resonator, circuitry configured to receive an input signal (e.g., input signal 95, may also be referred to as a qubit control signal), and corresponding circuitry configured to amplify and output a signal. In some embodiments, adjustable device 93 includes a controllable switch and a plurality of standard devices for calibration. In some embodiments, the standard devices for calibration use standards such as Open\Short\Fixed Load\Thru, and input signal 21 may be calibrated based on these different standards.

In some embodiments, input signal 95 is transmitted using a coaxial cable. Input signal 95 may include a signal for controlling a qubit and may be generated by a control signal generator. For example, input signal 95 may include a microwave signal or a laser signal. Those skilled in the art can select any suitable signal generator and select parameters, such as phase, intensity, and frequency, of input signal 95 according to the desired control over the qubit. The selected parameters may be simultaneously transmitted to a control device (e.g., control signal generator 105, a module of control signal generator 105, or control device 103 communicatively coupled to control signal generator 105, FIG. 10) for controlling (e.g., adjusting) input signal 95 to provide more precise control of the qubit.

In some embodiments, the qubit is based on a superconducting Josephson junction.

In some embodiments, PCB 97 is placed in a low-temperature environment in use. The low-temperature environment may include a temperature range from 100 mK to 4.2 K (K refers to Kelvin). The low-temperature environment may be provided by, for example, but is not limited to, a dilution refrigerator. In some embodiments, input signal 95 may be distorted when transmitted from a room temperature environment (or a relatively high-temperature region) to the low-temperature environment. For example, the parameters such as phase, intensity, and frequency, of input signal 95, may change. As a result, when input signal 95 is transmitted to qubit processing unit 92, the actual phase, intensity, frequency and other parameters will deviate from the corresponding preset values, thereby making the control process over the qubit more difficult, less accurate, or even uncontrollable.

In some embodiments, input signal 95 may be inputted to qubit processing unit 92 via first mode selection device 91 to control the qubit or may be inputted to adjustable device 93 for calibration. When input signal 91 is inputted to adjustable device 93, detection signal 96 is obtained. Since qubit processing unit 92 and adjustable device 93 are placed close to each other (e.g., in the same environment), input signal 95 arrived at adjustable device 93 may be substantially similar or identical to input signal 95 arrived at qubit processing unit 92.

In some embodiments, detection signal 96 is further fed back to the control device (e.g., to provide information used to control or adjust input signal 95 transmitted to qubit processing unit 92 on PCB 97 for more precise control of qubit) the second mode selection device 94. A feedback path of detection signal 96 may include transmission "through," or via "reflection," or a combination thereof. In some embodiments, the control device obtains a degree of deviation between the signal actually arrived at adjustable device 93 and input signal 95 according to relevant parameters of detection signal 96 and initial parameters of input signal 95. The obtained degree of deviation may be used to make corresponding adjustment to input signal 95 generated by the control signal generator (e.g., control signal generator 105, FIG. 10). In some examples, the adjustment may include adjustment to any one or more of the above-mentioned parameters, such as phase, intensity, or frequency.

In some embodiments, the above process may be repeated multiple times until the degree of deviation reaches a preset range of convergence. In some examples, the preset range of convergence may include that deviation between any parameter, e.g., phase, intensity, or frequency, of detection signal 96 and the corresponding parameter of input signal 95 is less than a preset value. In some other examples, the preset range of convergence may include that the deviation of each of phase, intensity, and frequency between detection signal 96 and input signal 95 is less than a preset value. In yet some other examples, the preset range of convergence may include that the deviation between one or more set function values of phase, intensity and frequency of detection signal 96 and the corresponding set function values of input signal 95 is less than a preset value.

A relationship between the degree of deviation and the adjustment needed can be obtained by theoretical calculation, or by an empirical correspondence obtained according to an actual use environment, or through a combination thereof.

In some embodiments, through the above setting, input signal 95 finally arrived at qubit processing unit 92 may satisfy preset parameter values (e.g., including phase, intensity, or frequency, etc.), so that the qubit can be more precisely controlled.

FIG. 10 illustrates a schematic diagram of an example qubit measurement and control system 1000, according to some embodiments of the present disclosure. In some embodiments, environment 101 is a low-temperature environment as discussed above. Device 102 may include a qubit calibration device (e.g., qubit calibration device 200, 300, 400, 500, 600, 700, 800, or 900) as discussed in the above embodiments. For example, device 102 includes qubit processing unit 1021 (e.g., qubit processing unit 22, 32, 42, 52, 62, 72, 82, or 92 as discussed above) and adjustable device 1022 (e.g., adjustable device 23, 33, 43, 53, 63, 73, 83, or 93 as discussed above).

In some embodiments as shown in FIG. 10, qubit measurement and control system 1000 further includes a control device 103, a control signal generator 105 (e.g., for generating input signal 111, and for measuring or evaluating detection signal 110) coupled to device 102, and an optional computer 104. In some embodiments, control device 103 may also include a computer. In some embodiments, control device 103, computer 104, and control signal generator 105 are communicatively connected to each other. Detection signal 110 may be transmitted to control signal generator 105 first, and then processed by control device 103 and computer 104. Control device 103 may be used to control an automatic calibration system. Some embodiments of the processes of signal generation and calibration are as described above in the present disclosure.

In some embodiments, input signal 111 generated by control signal generator 105 is transmitted to device 102 placed in low-temperature environment 101. Input signal 111 may be transmitted to qubit processing unit 1021 for qubit processing or to adjustable device 1022 for qubit calibration. A feedback signal (e.g., detection signal 110 as discussed in the present disclosure) obtained from device 102 may be fed back to control signal generator 105. Control signal generator 105 (or control device 103 coupled to control signal generator 105) may compare detection signal 110 with input signal 111 (e.g., generated by control signal generator 105 and prior to being transmitted to qubit calibration device 102). For example, differences of one or more parameters (e.g., phase, intensity, or frequency as discussed above) between the detection signal 110 and input signal 111 are determined, so as to understand the signal distortion caused by the temperature change from a room temperature environment (e.g., at control signal generator 105) to low-temperature environment 101 (e.g., at device 102). In some embodiments, based on the parameter deviation caused by the signal distortion, control signal generator 105 may adjust one or more parameters of the generated input signal 111, so as to feed desired input signal 111 into device 102 for qubit control with improved precision.

Figure 11:
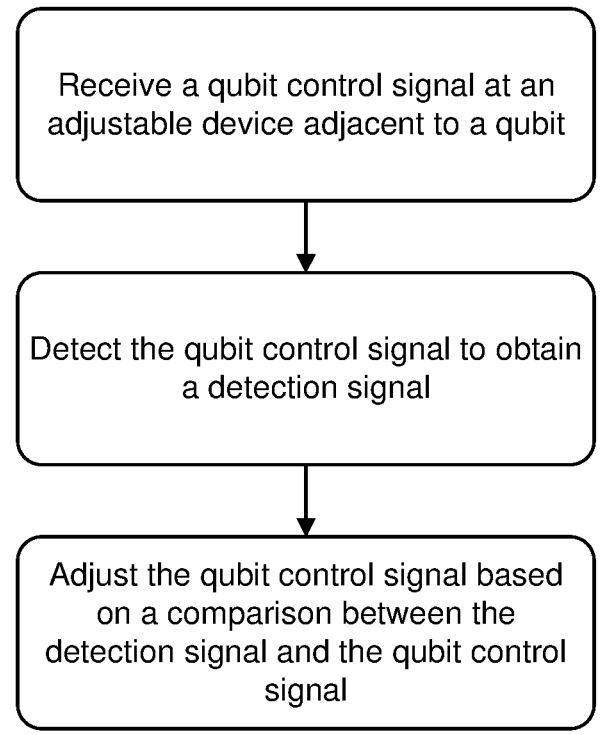
FIG. 11 is a flowchart of an example qubit measurement and control method, according to some embodiments of the present disclosure.

FIG. 11 illustrates a flowchart of an example qubit measurement and control method, according to some embodiments of the present disclosure. The method includes: receiving a qubit control signal at a calibration device (e.g., an adjustable device 1022, FIG. 10) corresponding (adjacent) to a qubit; detecting the qubit control signal to obtain a detection signal; and adjusting (e.g., via control signal generator 105, or control device 103 coupled to control signal generator 105, FIG. 10), at least based on a comparison between the detection signal and the qubit control signal, the control signal for controlling the qubit, so that the control signal transmitted to a qubit can be more accurately controllable.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is to be understood that the above description is intended to be illustrative and not restrictive. For example, the embodiments (or aspects thereof) described above may be used in conjunction with each other. In addition, many modifications may be made to adapt a particular situation or content to the teachings of some embodiments without departing from the scope of the embodiments. While the dimensions and types of materials described herein are intended to define parameters of some embodiments, the embodiments are by no means restrictive, but rather illustrative embodiments. Many other embodiments will be apparent to those skilled in the art upon review of the description. The scope of some embodiments should be determined by reference to the appended claims and the full scope of equivalents covered by such claims. In the appended claims, the terms "include" and "wherein" are used as readable language equivalents of the corresponding terms "comprise" and "where." In addition, in the appended claims, the terms "first," "second," "third," etc. are used merely as labels, and they are not intended to impose numerical requirements on their objects. In addition, the limitations of the appended claims are not to be written in a format of means and functions.

It should be also explained that terms "include," "comprise" or any other variations thereof are intended to contain non-exclusive inclusion, so that processes, methods, goods or equipment including a series of factors not only include the factors, but also include other factors which are not clearly listed, or also include inherent factors of the processes, methods, goods or equipment. The factors restrained by a statement "include a . . . " shall not exclude that other same factors also exist in the processes, methods, goods or equipment including the factors under the condition that no more restraints are required.

Those skilled in the art should understand that some embodiments of the disclosure may be provided as a method, equipment or a computer program product. Thus, a form of complete hardware embodiment, a form of complete software embodiment or a form of embodiment integrating software and hardware may be adopted in the disclosure. Moreover, a form of computer program product implemented on one or more computer available storage media (including, but not limited to, a disk memory, a CD-ROM, an optical memory and the like) containing computer available program codes may be adopted in the disclosure.

The computer readable media comprise non-volatile and volatile, removable and non-removable media. Information can be saved in any way or by any technology. Information can be computer readable instructions, data structures, program modules or other data. Examples of the storage media of the computer comprise but are not limited to phase-change random access memory (PRAM), static random access memory (SRAM), dynamic random access memory (DRAM), other types of random access memories (RAM), read-only memory (ROM), electrically erasable programmable read-only memory (EEPROM), flash memory or other memory technologies, compact disk-read only memory (CD-ROM), digital versatile disc (DVD) or other optical memories, cassette tape, tape and disk memory or other magnetic memories or any other non-transport media. The storage media can be used for saving the information which a computing device can access. According to the definition herein, the computer readable medium does not comprise computer readable transitory media, such as modulated data signals and carrier waves.

The written description uses examples to disclose some embodiments, including an optimal mode, and also to enable those skilled in the art to practice some embodiments, including making and using any device or system, and performing any combination method. The scope of protection of some embodiments is defined by the claims, and may include other examples that are apparent to those skilled in the art. If such other examples have structural elements that are not different from the literal language of the claims, or if they include equivalent structural elements that are not substantially different from the literal language of the claims, they are intended to be within the scope of the claims.

The invention claimed is:

1. A qubit measurement and control system, comprising:
   a qubit processing unit including circuitry configured to process a qubit control signal received by the qubit processing unit using one or more qubits;
   an adjustable device disposed adjacent to the qubit processing unit and configured to measure and calibrate a qubit control signal received by the adjustable device, the adjustable device and the qubit processing unit being within a same temperature range; and
   a control signal generator communicatively connected to the qubit processing unit and the adjustable device, the control signal generator being configured to generate a qubit control signal to be transmitted to at least one of the qubit processing unit or the adjustable device.

2. The qubit measurement and control system according to claim 1, wherein the one or more qubits are based on a superconducting Josephson junction.

3. The qubit measurement and control system according to claim 1, further comprising: a first mode selection device configured to receive the qubit control signal and select a transmission path to at least one of the qubit processing unit or the adjustable device.

4. The qubit measurement and control system according to claim 1, further comprising: a second mode selection device configured to receive a signal from at least one of the qubit processing unit or the adjustable device and provide the signal to the control signal generator.

5. The qubit measurement and control system according to claim 1, wherein the qubit processing unit and the adjustable device are disposed on a same chip.

6. The qubit measurement and control system according to claim 1, wherein the qubit processing unit and the adjustable device are disposed on a same printed circuit board (PCB).

7. The qubit measurement and control system according to claim 5, wherein the qubit processing unit, the adjustable device, a first mode selection device and a second mode selection device are disposed on the same chip.

8. The qubit measurement and control system according to claim 6, wherein the qubit processing unit, the adjustable device, a first mode selection device and a second mode selection device are disposed on the same printed circuit board (PCB).

9. The qubit measurement and control system according to claim 1, further comprising at least one regulator disposed between the control signal generator and the qubit processing unit.

10. The qubit measurement and control system according to claim 1, wherein the qubit control signal comprises a microwave signal or a laser signal.

11. The qubit measurement and control system according to claim 1, wherein the adjustable device is configured to receive the qubit control signal and generate a detection signal, wherein the detection signal is fed back to a control device, and the control device is configured to control, at least according to the detection signal, the control signal generator to adjust the qubit control signal.

12. The qubit measurement and control system according to claim 11, wherein the control signal generator is configured to adjust the qubit control signal by adjusting at least one of parameters including phase, intensity, or frequency.

13. The qubit measurement and control system according to claim 11, wherein the first mode selection device and the second mode selection device are configured to implement:
a plurality of control signal mode selections and control signal path selections respectively.

14. The qubit measurement and control system according to claim 13, wherein the control signal path selections comprise a reflection mode and a through mode.

15. The qubit measurement and control system according to claim 1, wherein the qubit processing unit and the adjustable device are disposed in a low-temperature environment comprising a liquid helium temperature zone.

* * * * *